US008949187B1

(12) United States Patent
Satish et al.

(10) Patent No.: US 8,949,187 B1

(45) Date of Patent: Feb. 3, 2015

(54) SYSTEMS AND METHODS FOR CREATING AND MANAGING BACKUPS BASED ON HEALTH INFORMATION

(75) Inventors: Sourabh Satish, Fremont, CA (US); William E. Sobel, Jamul, CA (US)

(73) Assignee: Symantec Corporation, Mountain View, CA (US)

( * ) Notice: Subject to any disclaimer, the term of this patent is extended or adjusted under 35 U.S.C. 154(b) by 899 days.

(21) Appl. No.: 12/130,786

(22) Filed: May 30, 2008

(51) Int. Cl.
*G06F 7/00* (2006.01)
*G06F 17/30* (2006.01)

(52) U.S. Cl.
USPC .......... 707/640; 707/649; 707/654

(58) Field of Classification Search
USPC .......... 707/640, 649, 999.204
See application file for complete search history.

(56) References Cited

U.S. PATENT DOCUMENTS 5,537,585 A * 7/1996 Blickenstaff et al. .......... 1/1
5,819,028 A * 10/1998 Manghirmalani et al. ...... 714/57
5,819,030 A * 10/1998 Chen et al. .......... 709/220
5,838,968 A * 11/1998 Culbert .......... 718/104
5,947,747 A * 9/1999 Walker et al. .......... 434/354
6,002,027 A * 12/1999 Sigwart et al. .......... 549/540
6,003,030 A * 12/1999 Kenner et al. .......... 1/1
6,377,907 B1 * 4/2002 Waclawski .......... 702/182
6,557,013 B1 * 4/2003 Ziff et al. .......... 707/608
7,698,316 B2 * 4/2010 Song et al. .......... 707/608
7,784,098 B1 * 8/2010 Fan et al. .......... 726/25
8,006,116 B1 8/2011 Sobel et al.
8,127,095 B1 * 2/2012 Colgrove et al. .......... 711/162
8,260,893 B1 * 9/2012 Bandhole et al. .......... 709/223
8,360,893 B2 * 1/2013 Howard .......... 472/43
8,555,287 B2 * 10/2013 Ding et al. .......... 718/104
2002/0133491 A1 * 9/2002 Sim et al. .......... 707/10
2003/0088668 A1 * 5/2003 Stanley .......... 709/224
2005/0021733 A1 * 1/2005 Clinton et al. .......... 709/224
2005/0096953 A1 * 5/2005 Washington et al. .......... 705/7
2005/0114614 A1 5/2005 Anderson et al.
2006/0190521 A1 * 8/2006 Kojima .......... 709/200
2007/0088630 A1 * 4/2007 MacLeod et al. .......... 705/28
2007/0233854 A1 * 10/2007 Bukovec et al. .......... 709/224
2008/0059208 A1 * 3/2008 Rockfeller et al. .......... 705/1
2008/0065974 A1 * 3/2008 Campbell .......... 715/200
2008/0177994 A1 * 7/2008 Mayer .......... 713/2
2008/0310628 A1 * 12/2008 Fujioka et al. .......... 380/201
2009/0037367 A1 * 2/2009 Wein .......... 707/2
2010/0077160 A1 * 3/2010 Liu et al. .......... 711/162

(Continued)

OTHER PUBLICATIONS

Mac Basics: Time Machine backs up your Mac; Sep. 4, 2008; http://support.apple.com/kb/HT1427.

(Continued)

*Primary Examiner* — Daniel Kuddus

(74) *Attorney, Agent, or Firm* — ALG Intellectual Property, LLC

(57) ABSTRACT

A computer-implemented method may include performing an evaluation of the computing system's health. The computer-implemented method may also include comparing results of the evaluation with the results of at least one prior evaluation of the computing system's health and then determining, based on the comparison, that a current state of health of the computing system is healthier than at least one prior state of health of the computing system. In addition, the computer-implemented method may include creating a backup of the computing system. A computer-implemented method for managing backups of a computing system based on health information is also disclosed. Corresponding systems and computer-readable media are also disclosed.

17 Claims, 11 Drawing Sheets

(56) References Cited

U.S. PATENT DOCUMENTS

| | | | | |
|---|---|---|---|---|
| 2010/0324945 | A1* | 12/2010 | Hessing | 705/4 |
| 2011/0105852 | A1* | 5/2011 | Morris et al. | 600/300 |

OTHER PUBLICATIONS

How to restore Windows XP to a previous state; Oct. 20, 2004; http://support.microsoft.com/kb/306084.

* cited by examiner

Health Scores 340

| Stability Score 342 | 67% |
|---|---|
| Performance Score 346 | 45% |
| Overall Health Score 348 | 56% |

System-Health Evaluation 300

| Stability Index 302 | |
|---|---|
| Running Average of Blue-Screen Errors | 0 |
| Running Average of Service Errors | 1 |
| Running Average of Application Errors | 1 |

304 306

| Performance Index 312 | |
|---|---|
| Running Average of CPU Usage | 2.1875 |
| Maximum CPU Usage | 7 |
| Running Average of Page Faults | 248.4375 |
| Maximum Number of Page Faults | 844 |
| Running Average of IP Datagrams | 3.2500 |
| Maximum Number of IP Datagrams | 8 |

| | Volume 702 | Date and Time 704 | Event Triggered? 706 | Health Scores 708 | Size 710 |
|---|---|---|---|---|---|
| 712 | C: | 7/1/2007 1:00:05 AM | No: Regularly-Scheduled Backup | Overall : 89<br>-Performance: 93<br>-Stability: 85<br>-Security: 89 | 11.2 MB |
| 714 | C: | 6/24/2007 9:22:25 AM | Yes: Service Pack 2, Build 2600 | Overall : 95<br>-Performance: 96<br>-Stability: 94<br>-Security: 95 | 8.7 MB |
| 716 | C: | 5/19/2007 6:06:16 PM | No: Regularly-Scheduled Backup | Overall : 72<br>-Performance: 73<br>-Stability: 71<br>-Security: 72 | 10.2 MB |

User Interface
800

| Volume 802 | Date and Time 804 | Event Triggered? 806 | Health Scores 808 | Size 809 | |
|---|---|---|---|---|---|
| C: | 7/1/2007 1:00:05 AM | No: Regularly-Scheduled Backup | Overall : 89<br>-Performance: 93<br>-Stability: 85<br>-Security: 89 | 11.2 MB | Delete 810 |
| C: | 6/24/2007 9:22:25 AM | Yes: Service Pack 2, Build 2600 | Overall : 95<br>-Performance: 96<br>-Stability: 94<br>-Security: 95 | 8.7 MB | Delete 812 |
| C: | 5/19/2007 6:06:16 PM | No: Regularly-Scheduled Backup | Overall : 72<br>-Performance: 73<br>-Stability: 71<br>-Security: 72 | 10.2 MB | Delete 814 |

*FIG. 8*

SYSTEMS AND METHODS FOR CREATING AND MANAGING BACKUPS BASED ON HEALTH INFORMATION

BACKGROUND

Conventional methods for backing up data typically involve creating a backup or snapshot of one or more volumes of a computing system on a predetermined schedule, upon the occurrence of a specified event (such as installation of an operating-system patch or update), or when requested by a user. For example, a conventional backup software program may automatically back up or snapshot a volume of a computing system prior to installing an operating-system patch in order to ensure that a pre-patch restore point exists. The restore point may allow a user to revert the computing system to an earlier state to fix any performance or stability issues caused by the operating-system patch.

Unfortunately, conventional backup software programs typically create snapshots or backups of a computing system regardless of the state of health (e.g., performance or stability) of the computing system. As such, a user may revert a computing system to an earlier state, only to find that the performance or stability of the computing system decreases. In addition, given the rate of change on modern-day computing systems, the amount of storage space occupied by such snapshots or backups may become unwieldy or unmanageable.

SUMMARY

As will be described in greater detail below, the instant disclosure generally relates to systems and methods for determining whether to create a backup or snapshot of a computing system based on the computing system's health. Systems and methods for managing backups or snapshots of a computing system based on health information are also disclosed.

For example, a method for determining whether to create a backup or snapshot of a computing system based on the computing system's health may comprise: 1) performing an evaluation of the computing system's health, 2) comparing the results of the evaluation with the results of a prior evaluation or evaluations, 3) determining, based on the comparison, that a current state of health of the computing system is healthier than one or more prior states of health of the computing system, and then 4) creating a backup or snapshot of the computing system. If a backup or snapshot is created, it may store health information derived from the evaluation as metadata.

The health of a system may be evaluated by evaluating the performance or stability of the system using various performance or stability metrics. As will be discussed in greater detail below, the health of a system may be expressed using a health score. This health score may represent an overall health score for the computing system, a performance score for the computing system, and/or a stability score for the computing system.

In an additional embodiment, a method for determining whether to create a backup or snapshot of a computing system based on the health of the computing system may comprise: 1) performing an evaluation of the computing system's health, 2) identifying, by analyzing the results of the evaluation, a current state of health of the computing system, 3) identifying a preferred state of health for the computing system (which may, as detailed below, represent a predetermined value set by an administrator), 4) determining, by comparing the current state of health of the computing system with the preferred state of health for the computing system, that the current state of health of the computing system is healthier than or equal to the preferred state of health for the computing system, and then 5) creating a backup or snapshot of the computing system.

As stated previously, systems and methods for managing snapshots or backups of a computing system, based on health information, are also disclosed. For example, a method for managing snapshots of a computer system based on health information may comprise: 1) identifying snapshots of the computing system, 2) identifying health information stored as metadata to each of the snapshots that identifies the state of health of the computing system when the backup was created, and then 3) determining, based on the health information, whether to delete one or more of the snapshots.

In one example, a determination of whether to delete one or more of the snapshots may involve: 1) determining whether a collective storage size for the snapshots exceeds a cache limit or snapshot-storage quota, 2) ranking each of the snapshots according to their state of health, and then 3) successively deleting snapshots having lower-ranking states of health until the collective storage size for the snapshots is less than or equal to the cache size or snapshot-storage quota. In certain examples, backups created within a specific date range (such as the last three days) may be excluded from such a determination.

Snapshots may be deleted automatically or with the assistance of a user. For example, determining whether to delete one or more of the snapshots may involve: 1) providing a user interface for displaying the health information for each of the snapshots to a user, 2) displaying the health information of each snapshot using the user interface, and then 3) receiving, via the user interface, a request from the user to delete the snapshot.

Systems and computer-readable media corresponding to the above-described methods are also disclosed. Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 3 is a block diagram illustrating the results of an exemplary health evaluation that may be performed according to at least one embodiment.

FIG. 8 is a block diagram of an exemplary user interface for displaying health information for a computing-system backup according to one embodiment.

Figure 1:
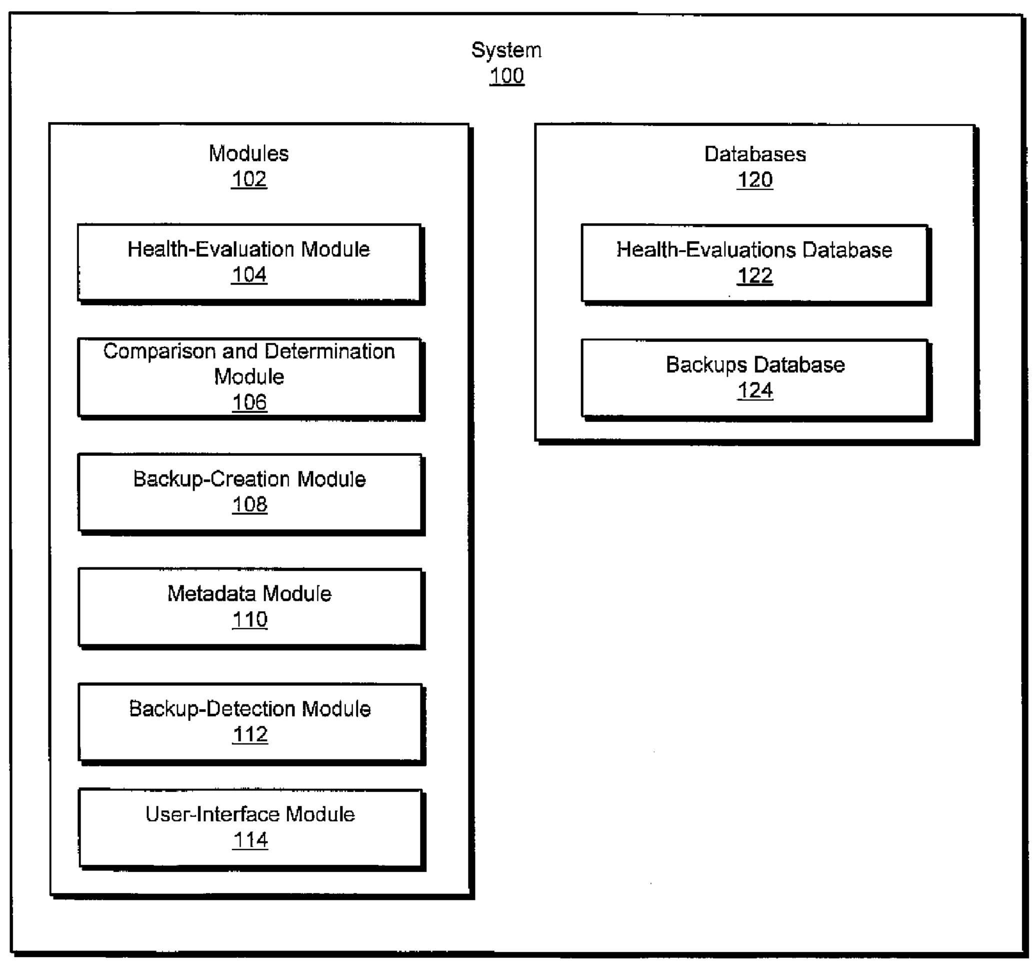
FIG. 1 is a block diagram of an exemplary system for creating and managing backups based on health information according to at least one embodiment.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

As will be described in greater detail below, the instant disclosure generally relates to systems and methods for creating and managing backups or snapshots of a computing system based on health information. The term "backup," as used herein, may refer to any type or form of backup or snapshot of at least a portion of a file, a program, or an entire computer system. In addition, the term "health," as used herein, generally refers to the overall wellness of a computing system. Similarly, the phrase "health information" may generally refer to information that identifies the state of health of a computing system. As detailed below, in certain embodiments the health of a computing system may be determined by evaluating the performance, stability, and/or state of security of the computing system.

The following will provide, with reference to FIG. 1, a detailed description of an exemplary system for: 1) determining whether to create a backup of a computing system based on the health of a computing system and 2) managing backups of a computing system based on health information. Descriptions of exemplary computing-system backups comprising health information stored as metadata will be provided in connection with FIGS. 4 and 7. A description of the results of an exemplary health evaluation that may be performed will be provided in connection with FIG. 3. Descriptions of corresponding exemplary user interfaces for use with this system will be provided in connection with FIGS. 8 and 9. Detailed descriptions of corresponding exemplary computer-implemented methods will also be provided in connection with FIGS. 2, 5 and 6.

FIG. 1 is a block diagram of an exemplary system 100 for creating and managing backups of a computing system based on health information. As illustrated in this figure, exemplary system 100 may comprise one or more modules for performing one or more tasks. For example, exemplary system 100 may comprise a health-evaluation module 104 for evaluating the health of a computing system (hereafter "health evaluations"). Exemplary system 100 may also comprise a comparison and determination module 106 for comparing the results of health evaluations, as explained in greater detail below.

In addition, exemplary system 100 may comprise a backup-creation module 108 for creating a computing-system backup containing information that identifies the state of health of a computing system at the time the backup is created. Exemplary system 100 may also comprise a metadata module 110 for creating and storing health information for a computing system as metadata to a backup of a computing system. In addition, system 100 may comprise a backup-detection module 112 for detecting one or more backups of a computing system and a user-interface module 114 for providing a user interface.

As illustrated in FIG. 1, exemplary system 100 may also comprise one or more databases 120. For example, exemplary system 100 may comprise a health-evaluations database 122 for storing the results of health evaluations performed by health-evaluation module 104. Exemplary system 100 may also comprise a backups database 124 for storing backups for one or more computing systems. Although illustrated as separate devices, one or more of databases 120 in FIG. 1 may represent portions of a single database or a single computing device.

In certain embodiments, one or more of modules 102 may represent one or more software applications or programs that, when executed by a computing device, may cause the computing device to perform one or more tasks required to create and manage backups of a computing system based on health information. For example, as will be described in greater detail below, one or more of modules 102 may represent software modules configured to run on one or more computing devices, such as exemplary computing system 1010 in FIG. 10 and/or portions of exemplary network architecture 1100 in FIG. 11. One or more of modules 102 may also represent all or portions of one or more special-purpose computers configured to perform one or more tasks required to create and manage backups of a computing system based on health information.

In addition, one or more of databases 120 in FIG. 1 may represent a portion of one or more computing devices. For example, one or more of databases 120 may represent a portion of exemplary computing system 1010 in FIG. 10 and/or portions of exemplary network architecture 1100 in FIG. 11. Alternatively, one or more of databases 120 may represent one or more physically separate devices capable of being accessed by a computing device, such as exemplary computing system 1010 in FIG. 10 and/or portions of exemplary network architecture 1100 in FIG. 11.

Figure 2:
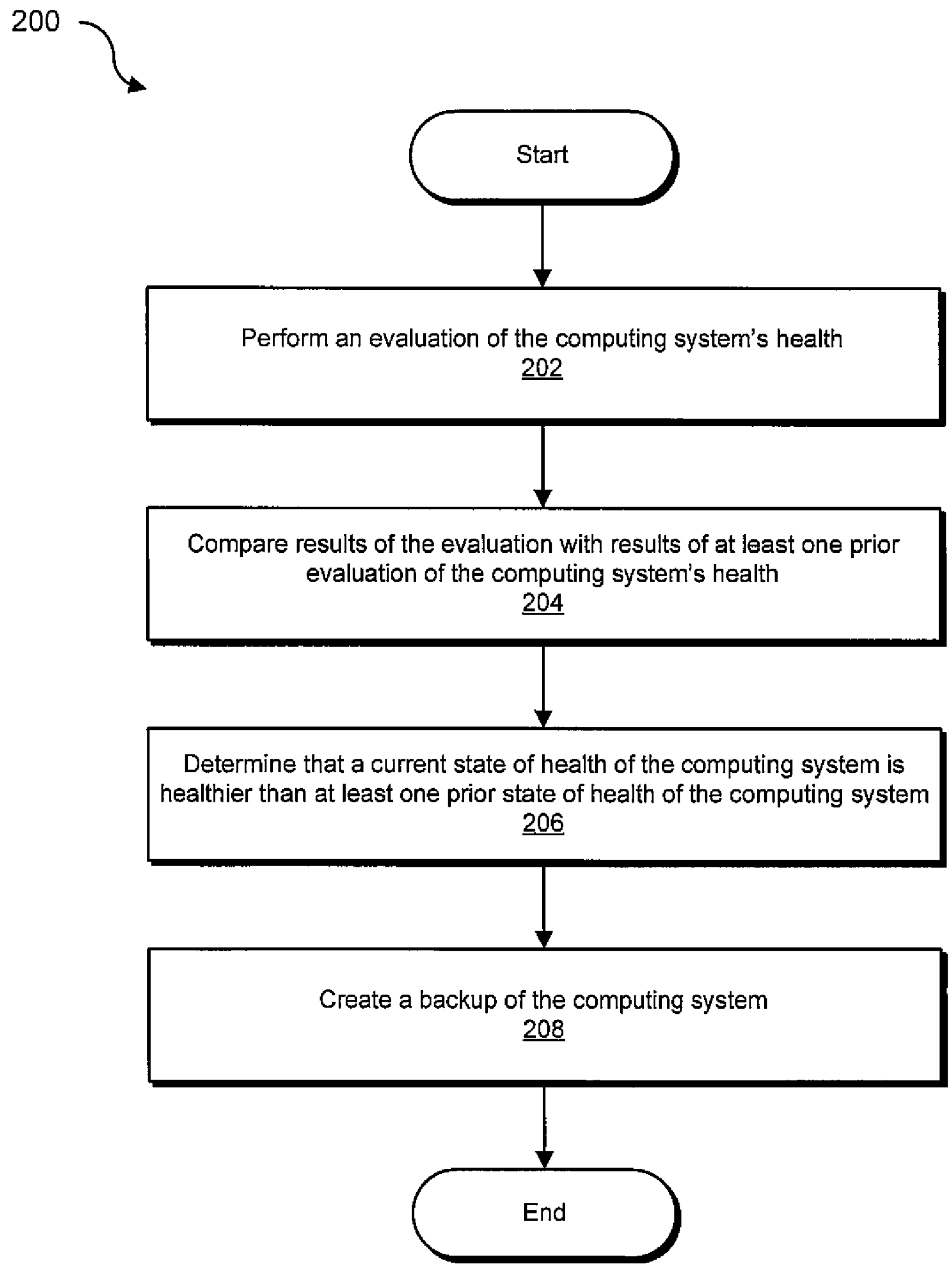
FIG. 2 is a flow diagram of an exemplary computer-implemented method for determining whether to create a backup of a computing system based on the health of the computing system in accordance with at least one embodiment.

FIG. 2 is a flow diagram of an exemplary computer-implemented method 200 for determining whether to create a backup of a computing system based on the health of the computing system. As illustrated in this figure, at step 202 the current state of health of the computing system may be determined by performing a health evaluation of the computing system. The phrase "health evaluation," as used herein, generally refers to any type or form of evaluation used to determine the health of a computing system. Examples of health evaluations include, without limitation, performance evaluations of a computing system (which may measure the performance of various aspects of the computing system, such as memory usage, CPU usage, and page faults), stability evaluations of a computing system (which may measure the stability of a computing system by determining, for example, the number of errors encountered by an operating system or an application installed on the computing system), and security evaluations (which may measure the state of security of a computing system by determining, for example, the number of security vulnerabilities experienced by the computing system).

Step 202 in FIG. 2 may be performed in a variety of ways. For example, health-evaluation module 104 in FIG. 1 may perform an evaluation of the health of exemplary computing system 1010 in FIG. 10 by analyzing the overall stability and performance of computing system 1010. An illustration of the results of such a health evaluation is provided in FIG. 3. As illustrated in this figure, system-health evaluation 300 may comprise a stability index 302 and a performance index 312. In certain embodiments, stability index 302 may comprise a plurality of stability metrics 304 and results 306 for each of these metrics.

Stability metrics 304 generally represent any type or form of metric that may be used to measure the stability of a system. Examples of values that stability metrics may measure include, without limitation, operating-system errors (such as blue-screen errors), application errors (such as application hangs or freezes), service errors, device-driver errors, system uptime, and system reboots (such as the number of system reboots per day). In the example provided in FIG. 3, stability index 302 details the average number of blue-screen errors identified by health-evaluation module 104 during the evaluation period (in this case, zero), the average number of service errors identified by health-evaluation module 104 (one), and the average number of application errors identified by health-evaluation module 104 (one).

As with stability index 302, performance index 312 may comprise a plurality of performance metrics 314 and results 316 for each of these metrics. Performance metrics 314 generally represent any type or form of metric that may be used to measure the performance of a computing system. Examples of values that performance metrics may measure include, without limitation, CPU usage, page faults, network usage (such as the number of IP datagrams), and memory usage. In the example provided in FIG. 3, performance index 312 details the computing system's maximum and average CPU usage during the evaluation period (in this case 7 and 2.1875, respectively), the maximum and average number of page faults experienced by the system during the evaluation period (844 and 248.4375, respectively), and the maximum and average number of IP datagrams sent and received by the system during the evaluation period (8 and 3.2500, respectively).

As illustrated in FIG. 3, the results 306 and 316 of stability metrics 304 and performance metrics 314 may be represented using running averages, maximum or peak values, incremental count values, or any other suitable method. Health evaluations may be performed periodically (such as every 24 hours), continuously, or may be event-triggered. For example, the health evaluation detailed in step 202 may be performed when an application or system-software change (such as an operating-system upgrade or installation of a service pack) occurs on the computing system. Alternatively, this health evaluation may represent the results of a periodic or continuous health evaluation of the computing system.

The health of a computing system may be expressed or quantified in a variety of ways. In certain embodiments, one or more health scores, such as health scores 340 in FIG. 3, may be calculated based on the results of system-health evaluation 300. As illustrated in FIG. 3, health scores 340 may represent the overall stability of the computing system (as represented by stability score 342) and/or the overall performance of the computing system (as represented by performance score 346). For example, stability score 342 may represent, in percentage form, how stable a computing system is relative to some maximum stability index. In the example illustrated in FIG. 3, the stability score for the computing system is 67%, which may mean that the computing system is roughly 33% less stable than might be desired or considered ideal. Similarly, performance score 346 may represent, in percentage form, how well a computing system is performing relative to some maximum stability index. In the example illustrated in FIG. 3, the performance score for the computing system is 45%, which may mean that the performance of the computing system is roughly 55% less than might be desired or considered ideal.

In at least one embodiment, an overall health score may be calculated for the computing system by averaging stability score 342 with performance score 346. In the example illustrated in FIG. 3, the overall health score for the computing system is 56%, which may mean that the overall health of the computing system is roughly 44% less than might be desired or considered ideal. As detailed above, the health of a computing system may be expressed or quantified in a variety of ways. As such, while the health evaluations and results illustrated in FIG. 3 have been described with a certain degree of particularity, the health of a computing system may be calculated or expressed using any number of additional heuristics, formulas, or methods.

Returning to FIG. 2, at step 204 the results of the evaluation performed in step 202 may be compared with the results of at least one prior evaluation of the computing system's health. For example, comparison and determination module 106 in FIG. 1 may compare the results of system-health evaluation 300 in FIG. 3 (e.g., health scores 340) with the results of at least one prior evaluation of the computing system's health.

Step 204 in FIG. 2 may be performed in a variety of ways. For example, in certain embodiments comparison and determination module 106 in FIG. 1 may compare health scores 340 in FIG. 3 with a running-average health score for the computing system. In at least one embodiment, this running-average health score for the computing system may be calculated by continuously or periodically evaluating the health of the computing system, calculating health scores based on the results of such an evaluation, and then averaging the health scores.

In an additional embodiment, step 204 in FIG. 2 may be performed by comparing the current health score for the computing system with at least one prior health score for the computing system. For example, comparison and determination module 106 in FIG. 1 may compare health scores 340 with at least one prior health score calculated for the computing system. Step 204 may also comprise identifying at least one prior backup of the computing device, identifying health information stored as metadata to the prior backup that identifies a prior state of health of the computing system when the prior backup was created (as detailed below in connection with step 208 in FIG. 2), and then comparing the prior state of health of the computing system with the current state of health of the computing system At step 206, the system may determine, based on the comparison in step 204, that a current state of health of the computing system is healthier than at least one prior state of health of the computing system. Step 206 may be performed in a variety of ways. For example, comparison and determination module 106 in FIG. 1 may determine that one or more of health scores 340 in FIG. 3 (which may represent the current state of health of the computing system) are higher than one or more prior health scores for the computing system. Similarly, comparison and determination module 106 in FIG. 1 may determine that one or more of health scores 340 in FIG. 3 are higher than one or more running-average health scores for the computing system.

Figure 4:
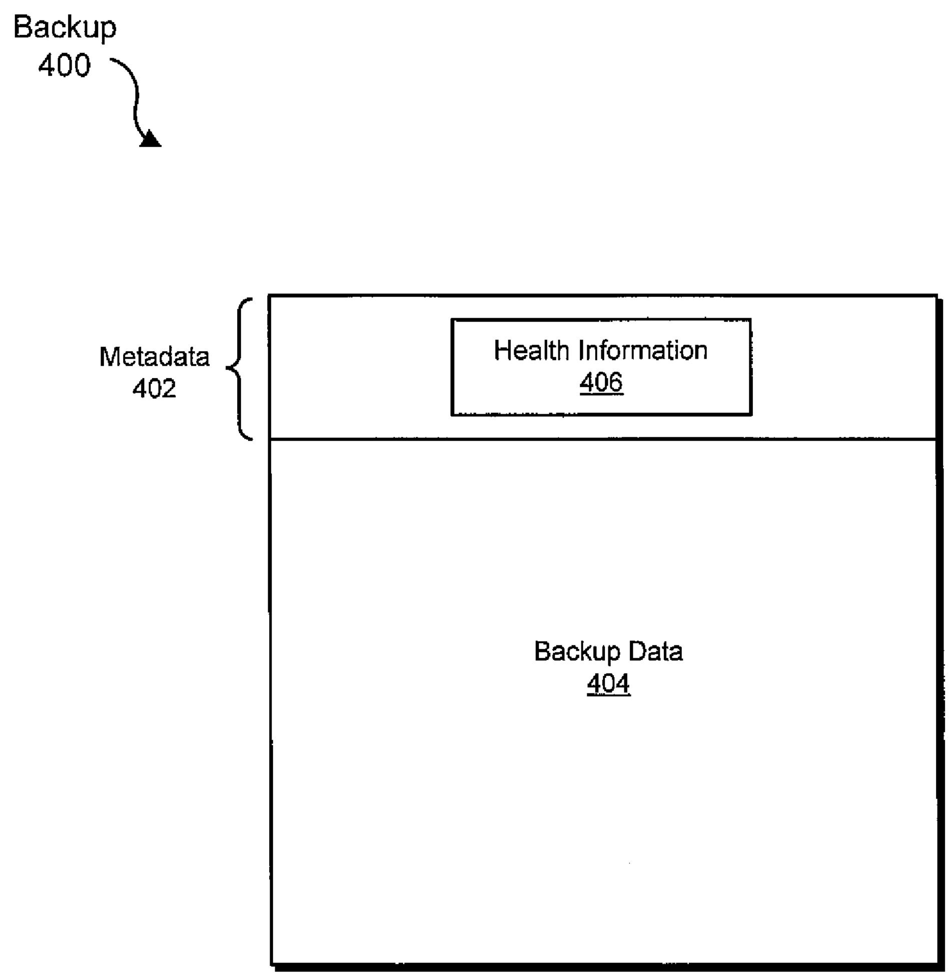
FIG. 4 is a block diagram of an exemplary computing-system backup comprising health information stored as metadata according to at least one embodiment.

If the current state of health of the computing system is healthier than at least one prior state of health of the computing system, then at step 208 a backup of the computing system may be created. FIG. 4 is a block diagram of an exemplary backup 400 that may be created in step 208 in FIG. 2. In certain embodiments, backup 400 may contain backup data 404 that may represent a backup of all or a portion of exemplary computing system 1010 in FIG. 10. Examples of backup 400 include, without limitation, snapshots, images, partial backups, full backups, incremental backups, differential backups, or any other suitable mechanism for backing up data.

In at least one embodiment, creating a backup of the computing system in step 208 may comprise storing health information for the computing system as metadata to the backup. For example, metadata module 110 in FIG. 1 may store health information 406 as metadata 402 to backup 400 in FIG. 4. In at least one embodiment, health information 406 may identify the state of health of the computing system when backup 400 in FIG. 4 was created. In certain embodiments, health information 406 may contain the results of a system-health evaluation, such as system-health evaluation 300 in FIG. 3. Additionally or alternatively, health information 406 may contain one or more health scores for a computing system, such as health scores 340 in FIG. 3.

Metadata 402 in FIG. 4 generally represents any type or form of data that describes additional data. In certain embodiments, metadata 402 may contain data that describes one or more characteristics of backup 400. Metadata 402 may also, in addition to comprising health information 406, identify one or more characteristics of backup 400. For example, metadata 402 may identify a date when backup 400 was created, a time when backup 400 was created, an event that triggered the creation of backup 400, and/or the size of backup 400. In certain embodiments, metadata 402 may be stored with and represent a portion of backup 400. In additional embodiments, metadata 402 may represent a separate or distinct file from backup 400. Upon completion of step 208 in FIG. 2, exemplary method 200 in FIG. 2 may terminate.

By creating a backup based on a computing system's health, a user may enjoy many benefits. For example, the process of backing up a computing system may require a large amount of the system's resources. However, if the computing system only creates backups when the system's health meets certain criteria, those resources may be allocated more effectively. Additionally, the amount of storage space reserved for storing backups may decrease, since only healthier, more desirable backups will be made.

Figure 5:
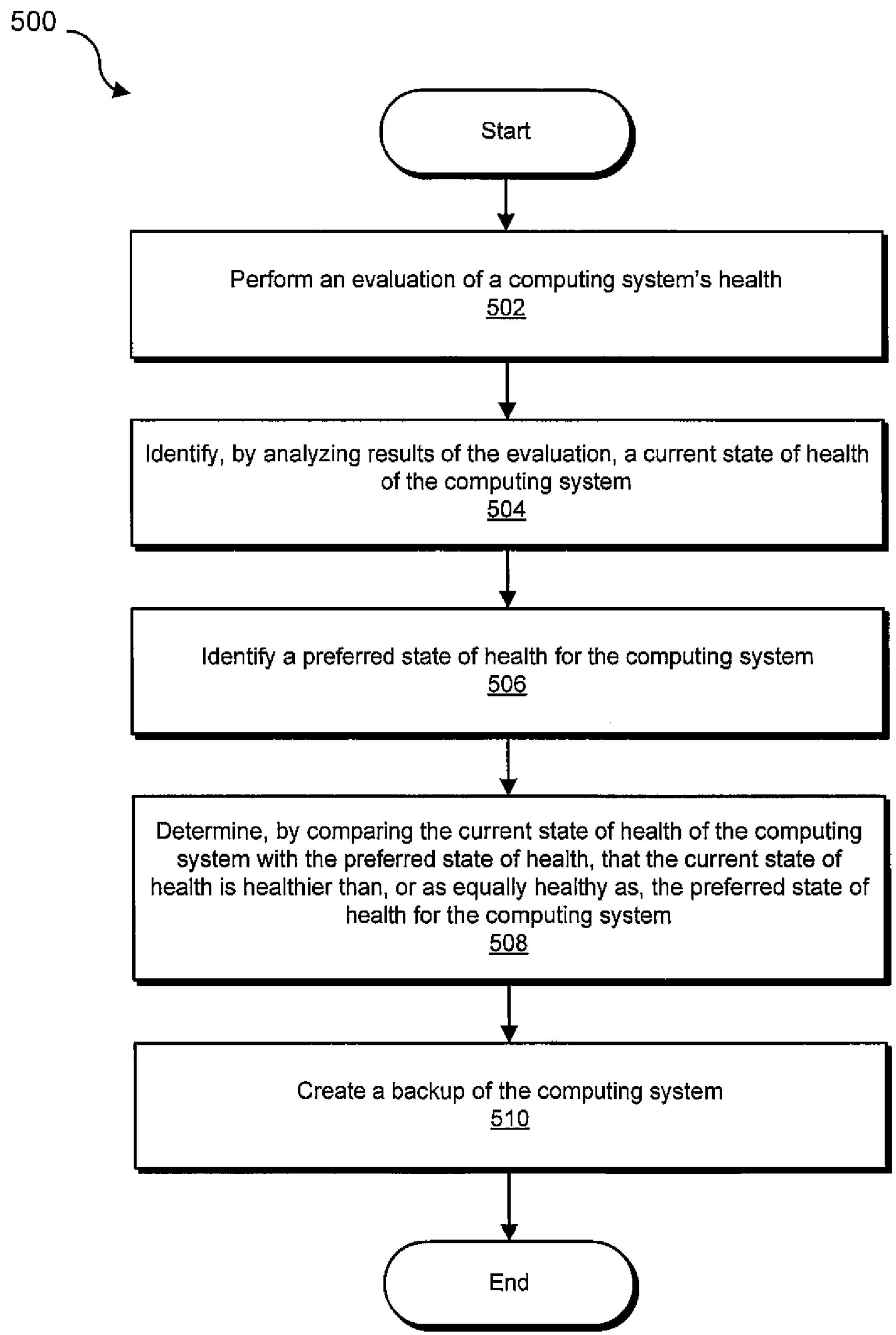
FIG. 5 is a flow diagram of an exemplary computer-implemented method for determining whether to create a backup of a computing system based on a preferred state of health of the computing system.

As detailed above, step 204 in FIG. 2 may be performed in a variety of ways. In one example, the current health score for the computing system may be compared with a baseline or preferred health score. FIG. 5 is a flow diagram of an exemplary computer-implemented method 500 for creating backups of a computing system based on a comparison between the current state of health of the computing system with some preferred state. As illustrated in this figure, at step 502 an evaluation of a computing system's health may be performed. For example, health-evaluation module 104 in FIG. 1 may perform an evaluation of the health of exemplary computing system 1010 in FIG. 10 by analyzing the overall stability and performance of computing system 1010.

In step 504, a current state of health may be identified. For example, health-evaluation module 104 in FIG. 1 may analyze the results of the evaluation performed in step 502. As detailed above, the results of such an evaluation may be expressed using one or more health score, such as health scores 340 in FIG. 3.

At step 506 in FIG. 5, a preferred state of health for the computing system may be identified. Step 506 in FIG. 5 may be performed in various ways. In at least one embodiment, comparison and determination module 106 in FIG. 1 may identify a predetermined value that may represent a preferred state of health. For example, an administrator may determine that any system having an overall health score of 90% or greater may be considered "healthy." In this example, comparison and determination module 106 in FIG. 1 may identify the health score of "90%" as the preferred state of health for the computing system.

At step 508 in FIG. 5, the system may determine, by comparing the current state of health with the preferred state of health, that the current state of health is healthier than, or equally as healthy as, the preferred state of health of the computing system. This comparison may be performed by comparison and determination module 106 in FIG. 1 and may reflect comparisons of stability scores, performance scores, security scores, and/or overall health scores.

After determining that the current state of health is healthier than, or as equally health as, the preferred state of health for the computing system, a backup of the computing system may be created at step 510 in FIG. 5. The creation of the backup may be performed in a manner similar to step 208 in FIG. 2. In this example, by indicating a preferred state of health for a computing system, an administrator may instruct that backups of the computing system be made only if a current state of health has an overall health score of 90% or greater. Upon completion of step 510 in FIG. 5, exemplary method 500 in FIG. 5 may terminate.

Figure 6:
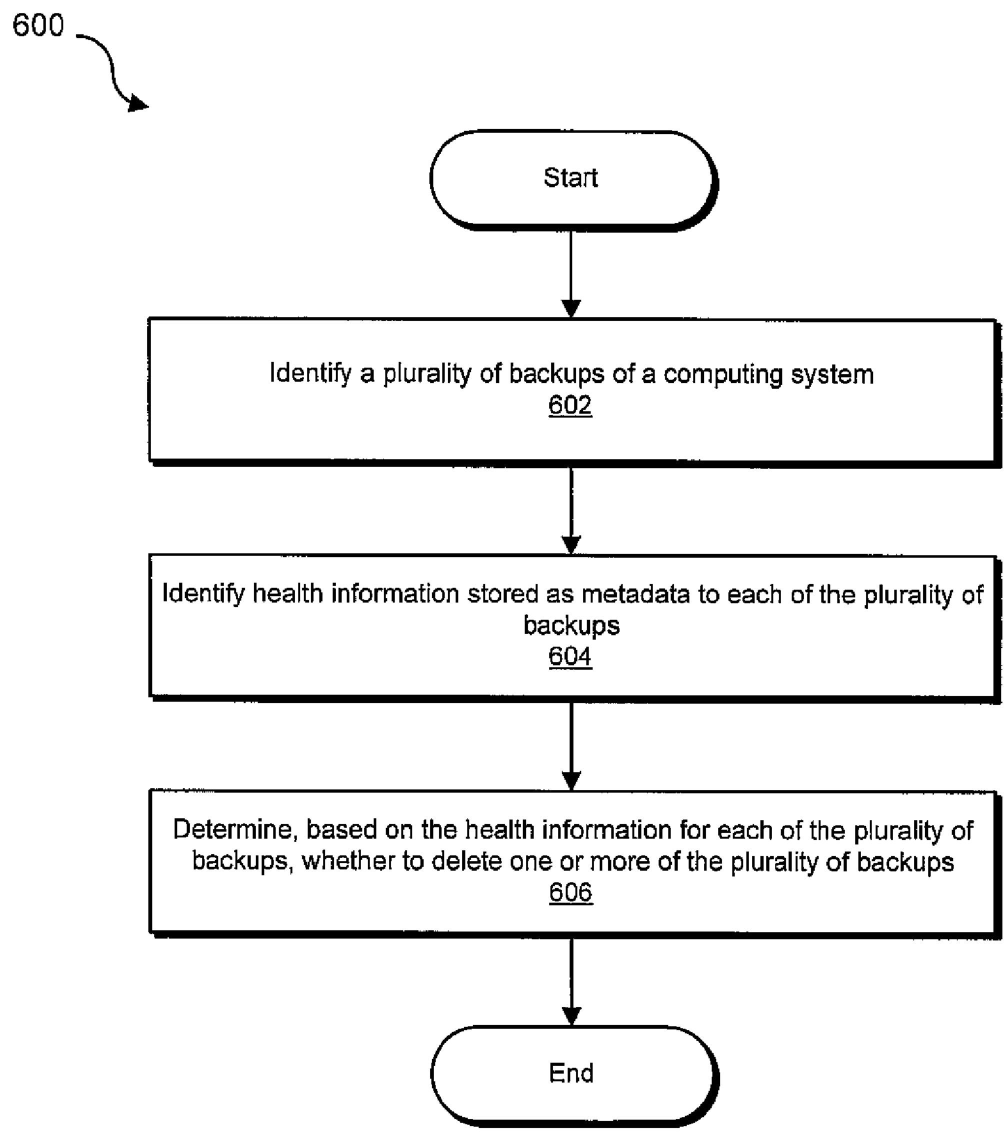
FIG. 6 is a flow diagram of an exemplary computer-implemented method for determining whether to delete a backup of a computing system based on health information in accordance with at least one embodiment.

As will be described in greater detail below, health information, such as health information 406 in FIG. 4, may be used to manage a plurality of snapshots or backups of a computing system. FIG. 6 is a flow diagram of an exemplary computer-implemented method 600 for managing snapshots or backups of a computing system based on health information. As illustrated in this figure, at step 602 a plurality of backups of a computing system may be identified. For example, backup-detection module 112 in FIG. 1 may identify a plurality of backups (such as backup 400 in FIG. 4) of computing system 1010 in FIG. 10. As detailed above, the term "backup," as used herein, may refer to any type or form of backup or snapshot of at least a portion of a file, a program, or an entire computer system.

Step 602 may be performed in a variety of ways. For example, in certain embodiments backup-detection module 112 may identify one or more backups of computing system 1010 in FIG. 10 stored in backups database 124 in FIG. 1. In certain embodiments, backup-detection module 112 may exclude backups that satisfy certain criteria. For example, backup-detection module 112 in FIG. 1 may exclude backups created within a specific date range (such as the last three days). In an additional embodiment, backup-detection module may exclude backups created in response to an event, such as an application or system software change (such as installation of an operating-system service pack or application upgrade).

Figure 7:
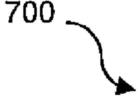
FIG. 7 is a block diagram of information that may be stored as metadata to backups of a computing system according to at least one embodiment.

At step 604, the system may identify health information stored as metadata to each of the plurality of backups. FIG. 7 is a block diagram of information that may be stored as metadata to a plurality of backups of a computing system. In this example, row 712 may represent information stored as metadata to a first backup of a computing system, while rows 714 and 716 may represent information stored as metadata to second and third backups of the computing system, respectively. As illustrated in this figure, the information stored as metadata to each of these backups may identify a volume 702 backed up by a computing-system backup, the date and/or time 704 when a backup was created, an event 706 that may have triggered creation of a backup, one or more health scores 708 for a backup, and/or the size 710 of a backup.

In the example illustrated in FIG. 7, row 712 may contain information for a first backup of Volume C created at 1:00:05 am on Jul. 1, 2007, row 714 may contain information for a second backup of Volume C created at 9:22:25 am on Jun. 24, 2007, and row 716 may contain information for a third backup of Volume C created at 6:06:16 pm on May 19, 2007. In this example, information contained within rows 712 and 716 may indicate that the first backup created on Jul. 1, 2007 and the third backup created on May 19, 2007 represent regularly-scheduled backups. Similarly, the information contained within row 714 may indicate that the second backup created on Jun. 24, 2007 was created in response to installation of Service Pack 2, Build 2600.

Rows 712, 714, and 716 may also contain information that identifies one or more health scores for each backup of Volume C. For example, rows 712, 714, and 716 may contain information that identifies an overall health score, a performance health score, a stability health score, and/or a security health score for each of the backups of Volume C. Rows 712, 714, and 716 may also contain information that identifies the size of each backup of Volume C.

Returning to FIG. 6, at step 606 the system may determine, based on the health information identified for each of the backups in step 604, whether to delete one or more of the backups. Step 606 in FIG. 6 may be performed in a variety of ways. In one embodiment, comparison and determination module 106 in FIG. 1 may: 1) identify, by analyzing and comparing the health information for each of the backups (as illustrated in FIG. 7), a backup with the lowest state of health and then 2) delete the backup with the lowest state of health. For example, comparison and determination module 106 in FIG. 1 may determine that the third backup of Volume C created on May 19, 2007 has individual and overall health scores that are lower than those of the first backup and second backup of Volume C created on Jul. 1, 2007 and Jun. 24, 2007, respectively. Comparison and determination module 106 may then delete or remove the third backup of Volume C created on May 19, 2007 from storage of the computing systems since this backup is less likely to be used in the future. Upon completion of step 606, exemplary method 600 in FIG. 6 may terminate.

As detailed above, many conventional backup and restore software programs implement a cache limit or snapshot-storage quota to limit the number and size of snapshots that may be stored. In certain embodiments, exemplary system 100 in FIG. 1 may implement such a snapshot-storage quota to limit the number or size of snapshots of a computing system that may be stored. In this example, step 606 in FIG. 6 may comprise: 1) ranking each of the plurality of snapshots according to their state of health, 2) determining whether a collective storage size for the plurality of snapshots exceeds a snapshot-storage quota, and then 3) successively deleting snapshots having lower-ranking states of health until the collective storage size for the plurality of snapshots is less than or equal to the snapshot-storage quota.

For example, exemplary system 100 may implement a cache limit or snapshot-storage quota of 20 MB. In this embodiment, the information illustrated in FIG. 7 may represent health information for a plurality of snapshots created for a computing system. In this example, comparison and determination module 106 in FIG. 1 may determine that the collective size of the snapshots illustrated in FIG. 7 exceeds 20 MB. In order to satisfy the snapshot-storage quota of 20 MB for exemplary system 100, comparison and determination module 106 in FIG. 1 may rank each snapshot illustrated in FIG. 7 according to their state of health. For example, comparison and determination module 106 may rank the second snapshot of Volume C created on Jun. 24, 2007 as having the highest overall state of health since the overall health score for this snapshot (95) is higher than the overall health scores for the snapshots created on Jun. 24, 2007 and Jul. 1, 2007, respectively. Similarly, comparison and determination module 106 may determine that the third snapshot of Volume C created on May 19, 2007 has the lowest overall state of health since the overall health score for this snapshot (72) is lower than the overall health scores for the snapshots created on Jul. 1, 2007 and Jun. 24, 2007.

Comparison and determination module 106 may then successively delete snapshots having lower-ranking states of health into the collective storage size for the plurality of snapshots is less than or equal to the cache limit or snapshot-storage quota. For example, comparison and determination module 106 may delete the third snapshot of Volume C created on May 19, 2007 since this snapshot has the lowest overall health score. After deleting the third snapshot of Volume C created on May 19, 2007, comparison and determination module 106 may then again determine whether a collective storage size for the remaining snapshots exceeds the snapshot-storage quota. In this example, comparison and determination module 106 may determine that the collective storage size for the first and second snapshots created on Jul. 1, 2007 and Jun. 24, 2007, respectively, (19.9 MB) is less than the snapshot-storage quota (20 MB) step 606, and exemplary method 600 may then terminate.

As detailed above, step 606 may be performed either automatically by a computing system or with the assistance of a user. For example, step 606 may comprise displaying, using a user interface, the health information identified at step 604 to a user and then receiving, via the user interface, a request from the user to delete at least one backup. FIG. 8 is an illustration of an exemplary user interface 800 that may be used to display health information for one or more computing-system backups. As illustrated in this figure, user interface 800 may display a volume 802 backed up by a computing-system backup, the date and/or time 804 when a backup was created, an event 806 that may have triggered the creation of a backup, one or more health scores 808 for a backup, the size 809 of a backup, and/or user-selectable objects 810, 812, and 814.

In the example illustrated in FIG. 8, user interface 800 may display health information for a first backup of Volume C created at 1:00:05 am on Jul. 1, 2007, a second backup of Volume C created at 9:22:25 am on Jun. 24, 2007 and a third backup of Volume C created at 6:06:16 pm on May 19, 2007. In this example, user interface 800 may indicate that the first and third backups of Volume C created on Jul. 1, 2007 and May 19, 2007, respectively, represent regularly-scheduled backups. Similarly, user interface 800 may indicate that the second backup of Volume C created on Jun. 24, 2007 was created in response to installation of Service Pack 2, Build 2600.

User interface 800 may also display one or more health scores 808 for each backup of Volume C. For example, user interface 800 may display an overall health score, a performance health score, a stability health score, and/or a security health score for each of the backups of Volume C. User interface 800 may also display a size 809 of each of the backups of Volume C. In this example, a user may identify one or more backups from within the plurality of backups of Volume C to be deleted based on the information displayed by user interface 800. For example, a user may decide to delete the third backup of Volume C created on May 19, 2007 since the overall health score for this backup (72) is lower than the overall health scores for the backups created on Jul. 1, 2007 and Jun. 24, 2007, respectively. In this example, the user may delete the backup created on May 19, 2007 by selecting user-selectable object 814.

Figure 9:
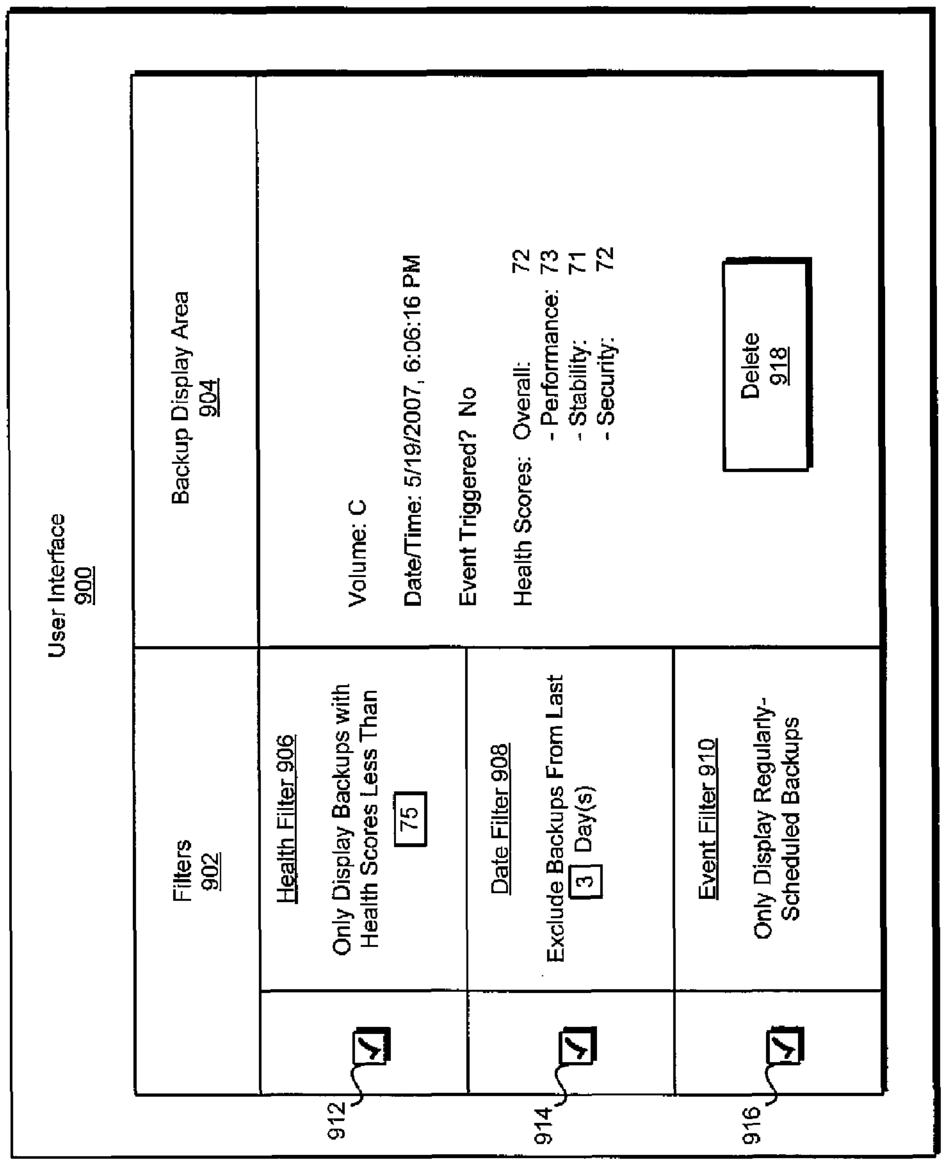
FIG. 9 is a block diagram of an exemplary user interface for selectively displaying health information for a computing-system backup according to an additional embodiment.

User interface 800 generally represents any type or form of locally-executed or web-based user interface. In addition, while user interface 800 has been described with a certain degree of particularity, various other user interfaces may be provided to display health information for computing-system backups to a user. For example, FIG. 9 is an illustration of an exemplary user interface 900 for displaying health information for computing-system backups according to an additional embodiment. In this example, user interface 900 may enable a user to search, sort, or filter the health information to be displayed for one or more computing-system backups.

For example, user interface 900 may display one or more filters 902 that may allow a user to limit the results displayed within a backup display area 904. For example, a user may request that only backups having health scores that are lower than a certain number (such as 75) be displayed within display area 904 by checking user-selectable box 912. Similarly, a user may exclude backups created within a certain date range (such as the last three days) from being displayed within display area 904 by checking user-selectable box 914. A user may also request that only regularly-scheduled backups be displayed within display area 904 by checking user-selectable box 916. A user may then request that a backup displayed within display area 904 be deleted by selecting user-selectable object 918.

As detailed above, user interface 900 may enable a user to search, sort, or filter the health information to be displayed for one or more computing-system backups. For example, a user may, by interacting with user interface 900 (and/or variations of user interface 900), request that: 1) only backups with low heath scores be displayed, 2) recently-created backups be excluded from display in display area 904, and 3) special backups created in response to an event (such as installation of a service pack) be excluded from display in display area 904.

As detailed above, any type or form of user interface may be used to display health information for computing-system backups to a user. As such, while user interfaces 800 and 900 have been described with a certain degree of particularity, numerous variations may be made thereto. For example, in certain embodiments providing a user interface may comprise displaying health information for a backup in a conventional user interface for a backup or restore program. For example, one or more health scores (such as health scores 340 in FIG. 3) may be displayed as an additional axis on a calendar or time-based graph displayed in a user interface for a conventional backup or restore program.

As detailed above, the methods and systems disclosed herein may enable a user or a system to create and manage backups based on health information. For example, by evaluating the health of a computing system prior to creating a backup of the computing system, the methods and systems disclosed herein may automatically determine optimal opportunities for creating a backup of the computing system. In at least one embodiment, this may enable a user or a system to restore a computing system to its healthiest state based on health information. The exemplary systems and methods disclosed herein may also enable a user or a system to better manage snapshots by removing those snapshots from storage that are less likely to be useful or stable.

Figure 10:
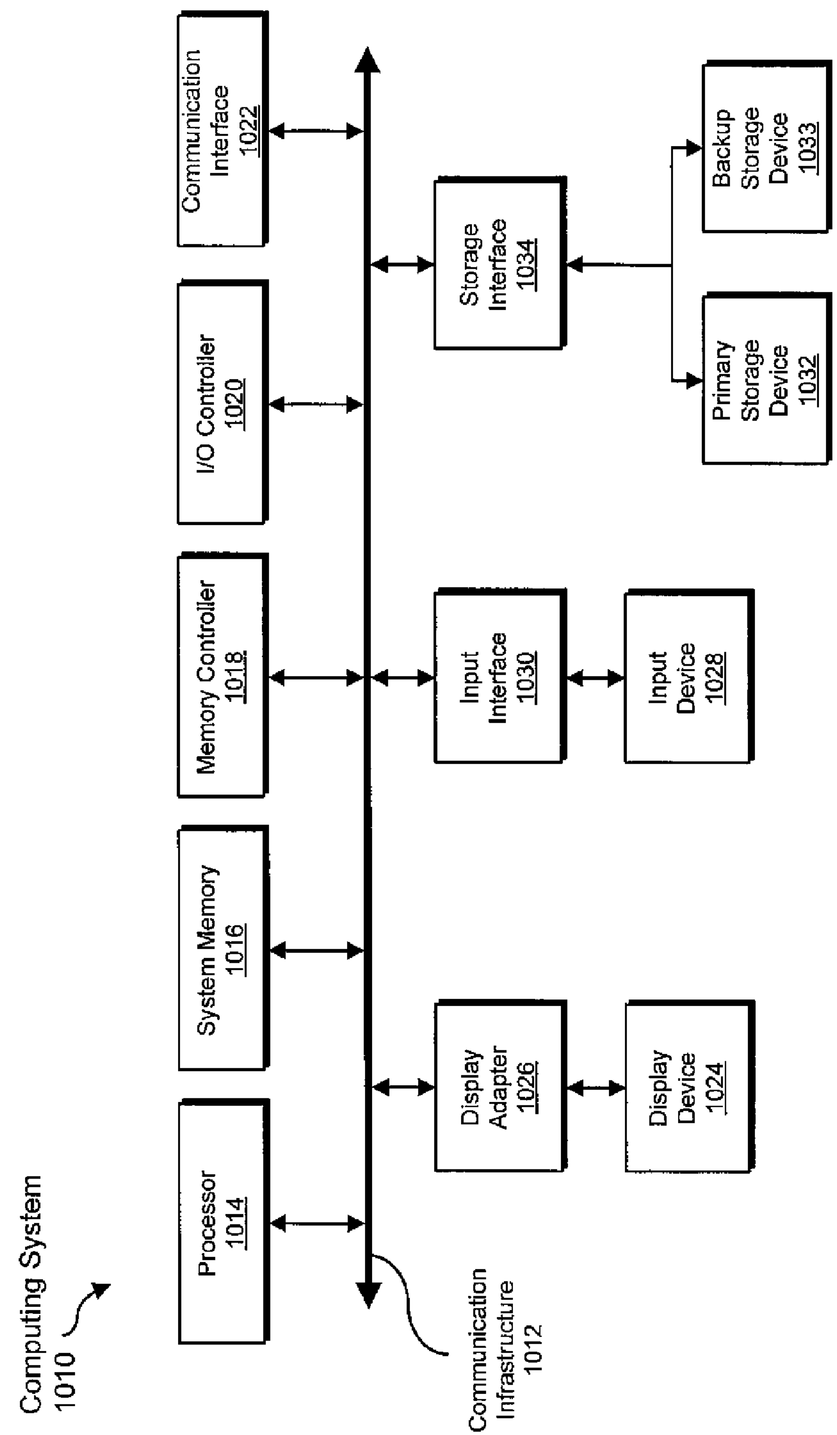
FIG. 10 is a block diagram of an exemplary computing system capable of implementing one or more of the embodiments described and/or illustrated herein.

FIG. 10 is a block diagram of an exemplary computing system 1010 capable of implementing one or more of the embodiments described and/or illustrated herein. Computing system 1010 broadly represents any single or multi-processor computing device or system capable of executing computer-readable instructions. Examples of computing system 1010 include, without limitation, workstations, laptops, client-side terminals, servers, distributed computing systems, handheld devices, or any other computing system or device. In its most basic configuration, computing system 1010 may comprise at least one processor 1014 and a system memory 1016.

Processor 1014 generally represents any type or form of processing unit capable of processing data or interpreting and executing instructions. In certain embodiments, processor 1014 may receive instructions from a software application or module. These instructions may cause processor 1014 to perform the functions of one or more of the exemplary embodiments described and/or illustrated herein. For example, processor 1014 may perform and/or be a means for performing, either alone or in combination with other elements, one or more of the performing, comparing, determining, creating, storing, calculating, identifying, evaluating, analyzing, deleting, ranking, excluding, displaying, and receiving steps described herein. Processor 1014 may also perform and/or be a means for performing any other steps, methods, or processes described and/or illustrated herein.

System memory 1016 generally represents any type or form of volatile or non-volatile storage device or medium capable of storing data and/or other computer-readable instructions. Examples of system memory 1016 include, without limitation, random access memory (RAM), read only memory (ROM), flash memory, or any other suitable memory device. Although not required, in certain embodiments computing system 1010 may comprise both a volatile memory unit (such as, for example, system memory 1016) and a non-volatile storage device (such as, for example, primary storage device 1032, as described in detail below).

In certain embodiments, exemplary computing system 1010 may also comprise one or more components or elements in addition to processor 1014 and system memory 1016. For example, as illustrated in FIG. 10, computing system 1010 may comprise a memory controller 1018, an Input/Output (I/O) controller 1020, and a communication interface 1022, each of which may be interconnected via a communication infrastructure 1012. Communication infrastructure 1012 generally represents any type or form of infrastructure capable of facilitating communication between one or more components of a computing device. Examples of communication infrastructure 1012 include, without limitation, a communication bus (such as an ISA, PCI, PCIe, or similar bus) and a network.

Memory controller 1018 generally represents any type or form of device capable of handling memory or data or controlling communication between one or more components of computing system 1010. For example, in certain embodiments memory controller 1018 may control communication between processor 1014, system memory 1016, and I/O controller 1020 via communication infrastructure 1012. In certain embodiments, memory controller 1018 may perform and/or be a means for performing, either alone or in combination with other elements, one or more of the steps or features described and/or illustrated herein, such as performing, comparing, determining, creating, storing, calculating, identifying, evaluating, analyzing, deleting, ranking, excluding, displaying, and receiving.

I/O controller 1020 generally represents any type or form of module capable of coordinating and/or controlling the input and output functions of a computing device. For example, in certain embodiments I/O controller 1020 may control or facilitate transfer of data between one or more elements of computing system 1010, such as processor 1014, system memory 1016, communication interface 1022, display adapter 1026, input interface 1030, and storage interface 1034. I/O controller 1020 may be used, for example, to perform and/or be a means for performing, comparing, determining, creating, storing, calculating, identifying, evaluating, analyzing, deleting, ranking, excluding, displaying, and receiving steps described herein. I/O controller 1020 may also be used to perform and/or be a means for performing other steps and features set forth in the instant disclosure.

Communication interface 1022 broadly represents any type or form of communication device or adapter capable of facilitating communication between exemplary computing system 1010 and one or more additional devices. For example, in certain embodiments communication interface 1022 may facilitate communication between computing system 1010 and a private or public network comprising additional computing systems. Examples of communication interface 1022 include, without limitation, a wired network interface (such as a network interface card), a wireless network interface (such as a wireless network interface card), a modem, and any other suitable interface. In at least one embodiment, communication interface 1022 may provide a direct connection to a remote server via a direct link to a network, such as the Internet. Communication interface 1022 may also indirectly provide such a connection through, for example, a local area network (such as an Ethernet network or a wireless IEEE 802.11 network), a personal area network (such as a BLUETOOTH or IEEE Standard 802.15.1-2002 network), a telephone or cable network, a cellular telephone connection, a satellite data connection, or any other suitable connection.

In certain embodiments, communication interface 1022 may also represent a host adapter configured to facilitate communication between computing system 1010 and one or more additional network or storage devices via an external bus or communications channel. Examples of host adapters include, without limitation, SCSI host adapters, USB host adapters, IEEE 1394 host adapters, SATA and eSATA host adapters, ATA and PATA host adapters, Fibre Channel interface adapters, Ethernet adapters, or the like. Communication interface 1022 may also allow computing system 1010 to engage in distributed or remote computing. For example, communication interface 1022 may receive instructions from a remote device or send instructions to a remote device for execution. In certain embodiments, communication interface 1022 may perform and/or be a means for performing, either alone or in combination with other elements, one or more of the performing, comparing, determining, creating, storing, calculating, identifying, evaluating, analyzing, deleting, ranking, excluding, displaying, and receiving steps disclosed herein. Communication interface 1022 may also be used to perform and/or be a means for performing other steps and features set forth in the instant disclosure.

As illustrated in FIG. 10, computing system 1010 may also comprise at least one display device 1024 coupled to communication infrastructure 1012 via a display adapter 1026. Display device 1024 generally represents any type or form of device capable of visually displaying information forwarded by display adapter 1026. Similarly, display adapter 1026 generally represents any type or form of device configured to forward graphics, text, and other data from communication infrastructure 1012 (or from a frame buffer, as known in the art) for display on display device 1024.

As illustrated in FIG. 10, exemplary computing system 1010 may also comprise at least one input device 1028 coupled to communication infrastructure 1012 via an input interface 1030. Input device 1028 generally represents any type or form of input device capable of providing input, either computer or human generated, to exemplary computing system 1010. Examples of input device 1028 include, without limitation, a keyboard, a pointing device, a speech recognition device, or any other input device. In at least one embodiment, input device 1028 may perform and/or be a means for performing, either alone or in combination with other elements, one or more of the performing, comparing, determining, creating, storing, calculating, identifying, evaluating, analyzing, deleting, ranking, excluding, displaying, and receiving steps disclosed herein. Input device 1028 may also be used to perform and/or be a means for performing other steps and features set forth in the instant disclosure.

As illustrated in FIG. 10, exemplary computing system 1010 may also comprise a primary storage device 1032 and a backup storage device 1033 coupled to communication infrastructure 1012 via a storage interface 1034. Storage devices 1032 and 1033 generally represent any type or form of storage device or medium capable of storing data and/or other computer-readable instructions. For example, storage devices 1032 and 1033 may be a magnetic disk drive (e.g., a so-called hard drive), a floppy disk drive, a magnetic tape drive, an optical disk drive, a flash drive, or the like. Storage interface 1034 generally represents any type or form of interface or device for transferring data between storage devices 1032 and 1033 and other components of computing system 1010.

In certain embodiments, storage devices 1032 and 1033 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 1032 and 1033 may also comprise other similar structures or devices for allowing computer software, data, or other computer-readable instructions to be loaded into computing system 1010. For example, storage devices 1032 and 1033 may be configured to read and write software, data, or other computer-readable information. Storage devices 1032 and 1033 may also be a part of computing system 1010 or may be a separate device accessed through other interface systems.

In certain embodiments, the exemplary file systems disclosed herein may be stored on primary storage device 1032, while the exemplary file-system backups disclosed herein may be stored on backup storage device 1033. Storage devices 1032 and 1033 may also be used, for example, to perform and/or be a means for performing, either alone or in combination with other elements, one or more of the performing, comparing, determining, creating, storing, calculating, identifying, evaluating, analyzing, deleting, ranking, excluding, displaying, and receiving steps disclosed herein. Storage devices 1032 and 1033 may also be used to perform and/or be a means for performing other steps and features set forth in the instant disclosure.

Many other devices or subsystems may be connected to computing system 1010. Conversely, all of the components and devices illustrated in FIG. 10 need not be present to practice the embodiments described and/or illustrated herein. The devices and subsystems referenced above may also be interconnected in different ways from that shown in FIG. 10. Computing system 1010 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable medium. The phrase "computer-readable medium" generally refers to any form of device, carrier, or medium capable of storing or carrying computer-readable instructions. Examples of computer-readable media include, without limitation, transmission-type media, such as carrier waves, and physical media, such as magnetic-storage media (e.g., hard disk drives and floppy disks), optical-storage media (e.g., CD- or DVD-ROMs), electronic-storage media (e.g., solid-state drives and flash media), and other distribution systems.

The computer-readable medium containing the computer program may be loaded into computing system 1010. All or a portion of the computer program stored on the computer-readable medium may then be stored in system memory 1016 and/or various portions of storage devices 1032 and 1033. When executed by processor 1014, a computer program loaded into computing system 1010 may cause processor 1014 to perform and/or be a means for performing the functions of one or more of the exemplary embodiments described and/or illustrated herein. Additionally or alternatively, one or more of the exemplary embodiments described and/or illustrated herein may be implemented in firmware and/or hardware. For example, computing system 1010 may be configured as an application specific integrated circuit (ASIC) adapted to implement one or more of the exemplary embodiments disclosed herein.

Figure 11:
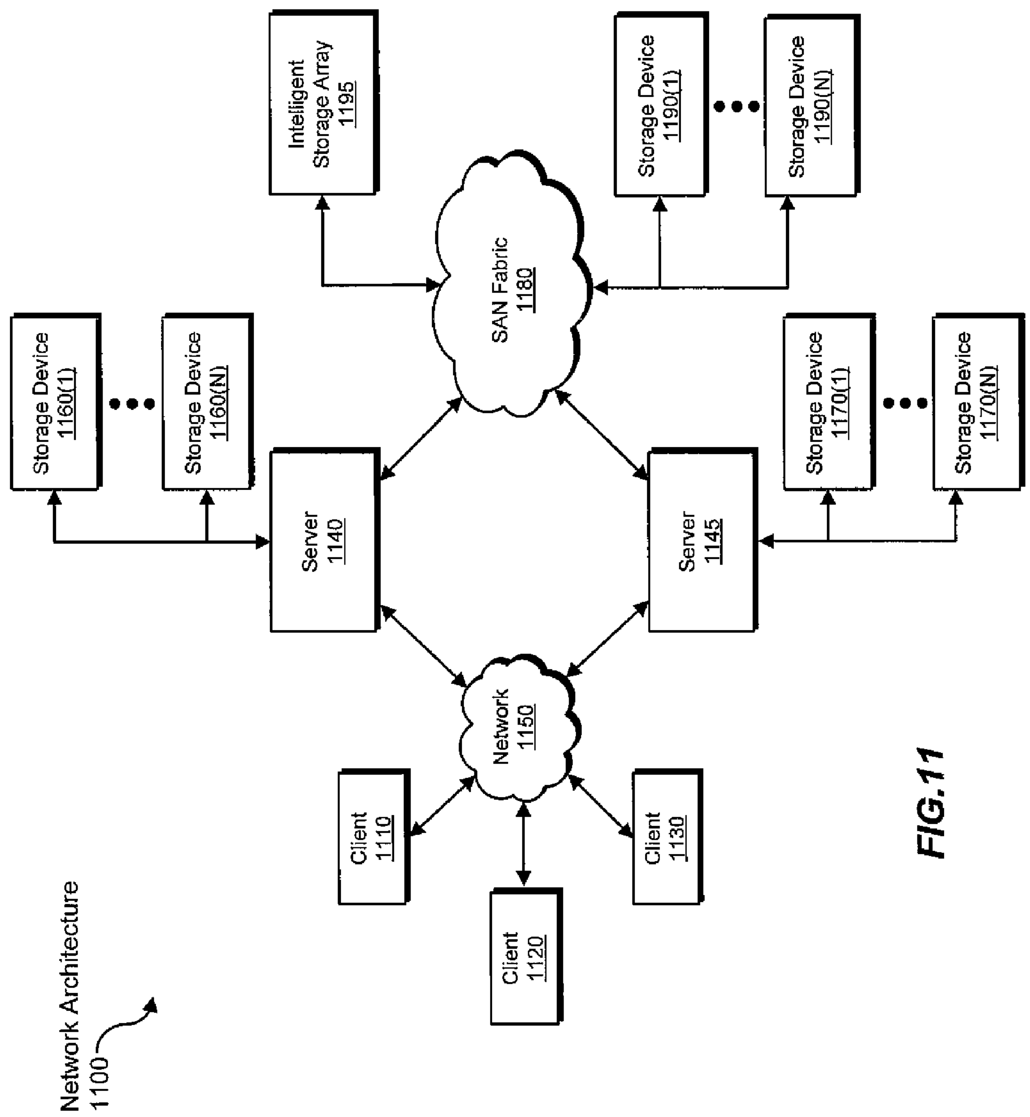
FIG. 11 is a block diagram of an exemplary computing network capable of implementing one or more of the embodiments described and/or illustrated herein.

FIG. 11 is a block diagram of an exemplary network architecture 1100 in which client systems 1110, 1120, and 1130 and servers 1140 and 1145 may be coupled to a network 1150. Client systems 1110, 1120, and 1130 generally represent any type or form of computing device or system, such as exemplary computing system 1010 in FIG. 10. Similarly, servers 1140 and 1145 generally represent computing devices or systems, such as application servers or database servers, configured to provide various database services and/or to run certain software applications. Network 1150 generally represents any telecommunication or computer network; including, for example, an intranet, a wide area network (WAN), a local area network (LAN), a personal area network (PAN), or the Internet.

As illustrated in FIG. 11, one or more storage devices 1160(1)-(N) may be directly attached to server 1140. Similarly, one or more storage devices 1170(1)-(N) may be directly attached to server 1145. Storage devices 1160(1)-(N) and storage devices 1170(1)-(N) generally represent any type or form of storage device or medium capable of storing data and/or other computer-readable instructions. In certain embodiments, storage devices 1160(1)-(N) and storage devices 1170(1)-(N) may represent network-attached storage (NAS) devices configured to communicate with servers 1140 and 1145 using various protocols, such as NFS, SMB, or CIFS.

Servers 1140 and 1145 may also be connected to a storage area network (SAN) fabric 1180. SAN fabric 1180 generally represents any type or form of computer network or architecture capable of facilitating communication between a plurality of storage devices. SAN fabric 1180 may facilitate communication between servers 1140 and 1145 and a plurality of storage devices 1190(1)-(N) and/or an intelligent storage array 1195. SAN fabric 1180 may also facilitate, via network 1150 and servers 1140 and 1145, communication between client systems 1110, 1120, and 1130 and storage devices 1190(1)-(N) and/or intelligent storage array 1195 in such a manner that devices 1190(1)-(N) and array 1195 appear as locally attached devices to client systems 1110, 1120, and 1130. As with storage devices 1160(1)-(N) and storage devices 1170(1)-(N), storage devices 1190(1)-(N) and intelligent storage array 1195 generally represent any type or form of storage device or medium capable of storing data and/or other computer-readable instructions.

In certain embodiments, and with reference to exemplary computing system 1010 of FIG. 10, a communication interface, such as communication interface 1022 in FIG. 10, may be used to provide connectivity between each client system 1110, 1120, and 1130 and network 1150. Client systems 1110, 1120, and 1130 may be able to access information on server 1140 or 1145 using, for example, a web browser or other client software. Such software may allow client systems 1110, 1120, and 1130 to access data hosted by server 1140, server 1145, storage devices 1160(1)-(N), storage devices 1170(1)-(N), storage devices 1190(1)-(N), or intelligent storage array 1195. Although FIG. 11 depicts the use of a network (such as the Internet) for exchanging data, the embodiments described and/or illustrated herein are not limited to the Internet or any particular network-based environment.

In at least one embodiment, all or a portion of one or more of the exemplary embodiments disclosed herein may be encoded as a computer program and loaded onto and executed by server 1140, server 1145, storage devices 1160(1)-(N), storage devices 1170(1)-(N), storage devices 1190(1)-(N), intelligent storage array 1195, or any combination thereof. All or a portion of one or more of the exemplary embodiments disclosed herein may also be encoded as a computer program, stored in server 1140, run by server 1145, and distributed to client systems 1110, 1120, and 1130 over network 1150. Accordingly, network architecture 1100 may perform and/or be a means for performing, either alone or in combination with other elements, one or more of the performing, comparing, determining, creating, storing, calculating, identifying, evaluating, analyzing, deleting, ranking, excluding, displaying, and receiving steps disclosed herein. Network architecture 1100 may also be used to perform and/or be a means for performing other steps and features set forth in the instant disclosure.

As detailed above, computing system 1010 and/or one or more of the components of network architecture 1100 may perform and/or be a means for performing, either alone or in combination with other elements, one or more steps of the exemplary methods described and/or illustrated herein. For example, a computer-implemented method for determining whether to create a backup of a computing system based on the health of the computing system, may comprise: 1) performing an evaluation of the computing system's health, 2) comparing results of the evaluation with the results of at least one prior health-evaluation, 3) determining, based on the comparison, that a current state of health of the computing system is healthier than at least one prior state of health of the computing system, and then 4) creating a backup of the computing system.

In some embodiments, the method may comprise storing health information for the computing system as metadata to the backup. The health information may identify the state of health of the computing system when the backup was created. The health information may further comprise a health score for the computing system. The metadata may further identify a date when the backup was created, a time when the backup was created, an event that triggered creation of the backup, the size of the backup, or any combination thereof.

According to some embodiments, performing the evaluation of the computing system's health may comprise creating a performance index based on at least one performance metric, a stability index based on at least one stability metric, or both. The performance metric may measure processor usage, memory usage, network usage, and/or page faults. The stability metric may measure operating-system errors, application errors, service errors, device-driver errors, system uptime, and/or system reboots.

Performing the evaluation of the computing system's health may comprise calculating a health score for the computing system. The health score may comprise an overall health score, a performance score, a stability score, or any combination of the same.

In some embodiments, comparing the results of the evaluation with the results of at least one prior evaluation of the computing system's health may comprise: 1) comparing the health score for the computing system with at least one prior health score for the computing system, 2) comparing the health score for the computing system with a running-average health score for the computing system, or both.

Comparing results of the evaluation with the results of at least one prior evaluation of the computing system's health may comprise, 1) identifying at least one prior backup of the computing device, 2) identifying health information stored as metadata to the prior backup that identifies the prior state of health of the computing system, and 3) comparing the prior state of health of the computing system with the current state of health of the computing system. According to some embodiments, the backup may comprise a snapshot, an image, a partial backup, a full backup, an incremental backup, or a differential backup of the computing system.

In some embodiments, performing the evaluation of the computing system's health may comprise periodically evaluating the health of the computing system and/or continuously evaluating the health of the computing system.

In another example, a computer-implemented method for determining whether to create a backup of a computing system based on the health of the computing system may comprise: 1) performing an evaluation of the computing system's health, 2) identifying, by analyzing results of the evaluation, a current state of health of the computing system, 3) identifying a preferred state of health for the computing system, 4) determining, by comparing the current state of health of the computing system with the preferred state of health for the computing system, that the current state of health of the computing system is healthier than or equal to the preferred state of health for the computing system, and then 5) creating a backup of the computing system.

In an additional embodiment, a computer-implemented method for managing backups of a computing system, based on health information, may comprise: 1) identifying backups of the computing system, 2) identifying health information stored as metadata to each of the backups, the health information for each backup identifying the state of health of the computing system when the backup was created, and 3) determining, based on the health information for each of the backups, whether to delete one or more backups.

In some embodiments, a determination of whether to delete the backups may involve identifying, by comparing the health information for each of the backups, a backup with the lowest state of health and then deleting the backup with the lowest state of health. The backups may comprise a plurality of snapshots of the computing system. In this example, a determination of whether to delete one or more of the snapshots may comprise: 1) determining whether a collective storage size for the plurality of snapshots exceeds a snapshot-storage quota, 2) ranking each of the plurality of snapshots according to their state of health, and 3) successively deleting snapshots having lower-ranking states of health until the collective storage size for the plurality of snapshots is less than or equal to the snapshot-storage quota.

Identifying the backups of the computing system may comprise excluding backups created within a specific date range and/or excluding backups created in response to an event. In at least one embodiment, the health information may comprise a health score, which in turn may comprise an overall health score, a performance score, a stability score of the computer system, or any combination of those three scores.

In certain embodiments, determining whether to delete one or more of the plurality of backups may comprise: 1) providing a user interface for displaying the health information for each of the backups to a user, 2) displaying the health information for each of the backups using the user interface, 3) receiving, via the user interface, a request from the user to delete at least one of the backups, and 4) deleting at least one backup identified in the request from the user. In a further embodiment, the health information may comprise a health score, which in turn may comprise an overall health score, a performance score, a stability score of the computer system, or any combination of those three scores.

In additional embodiments, computing system 1010 and/or one or more of the components of network architecture 1100 may represent a means for creating, either alone or in combination with other elements, a backup of a computing system that comprises backup data and metadata comprising health information that identifies the state of health of the computing system when the backup was created.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

Furthermore, while various embodiments have been described and/or illustrated herein in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may configure a computing system to perform one or more of the exemplary embodiments disclosed herein.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "a" or "an," as used in the specification and claims, are to be construed as meaning "at least one of." In addition, for ease of use, the words "including" and "having," as used in the specification and claims, are interchangeable with and have the same meaning as the word "comprising."

What is claimed is:

1. A computer-implemented method for determining whether to create a backup of a computing system based on a state of health of the computing system, the method being performed by at least one processor of the computing system, the method comprising:
- performing an evaluation of a current state of health of the computing system;
- calculating, based on the evaluation, a current health score for the computing system that represents the current state of health of the computing system;
- identifying a preferred health score for the computing system that represents a preferred state of health for the computing system;
- determining, by comparing the current health score for the computing system with the preferred health score for the computing system, that the current health score for the computing system is greater than the preferred health score for the computing system and that the current state of health of the computing system is healthier than or equal to the preferred state of health for the computing system;
- creating a backup of the computing system in response to determining that the current health score for the computing system is greater than the preferred health score for the computing system and that the current state of health of the computing system is healthier than or equal to the preferred state of health for the computing system;
- wherein performing the evaluation of the current state of health of the computing device comprises at least one of:
  - a performance index based on at least one performance metric;
  - a stability index based on at least one stability metric.

2. The method of claim 1, further comprising:
- storing health information for the computing system as metadata to the backup;
- wherein the health information identifies the current state of health of the computing system when the backup was created.

3. The method of claim 2, wherein the health information comprises the current health score for the computing system.

4. The method of claim 2, wherein the metadata further identifies at least one of:
- a date when the backup was created;
- a time when the backup was created;
- an event that triggered creation of the backup;
- a size of the backup.

5. The method of claim 1, wherein performing the evaluation of the current state of health of the computing system comprises:
- detecting at least one change to the computing system, wherein the change comprises at least one of:
- a change to an application on the computing system;
- a change to an operating system on the computing system;
- performing the evaluation of the current state of health of the computing system in response to detecting the change to the computing system.

6. The method of claim 1, wherein the current health score comprises at least one of:
- an overall health score for the computing system;
- a performance score for the computing system;
- a stability score for the computing system.

7. The method of claim 1, wherein the preferred health score comprises at least one of:
- at least one prior health score for the computing system;
- a running-average health score for the computing system;
- a predetermined value set by an administrator.

8. The method of claim 7, further comprising identifying the prior health score for the computing system by:
- identifying at least one prior backup of the computing system;
- identifying health information stored as metadata to the prior backup that identifies the prior health score for the computing system when the prior backup was created.

9. The method of claim 1, wherein the backup comprises at least one of:
- a partial backup of the computing system;
- a full backup of the computing system;
- an incremental backup of the computing system;
- a differential backup of the computing system.

10. The method of claim 1, wherein performing the evaluation of the current state of health of the computing system comprises at least one of:
- periodically evaluating the health of the computing system;
- continuously evaluating the health of the computing system.

11. A computer-implemented method for managing backups of a computing system based on health information, the method being performed by at least one processor of the computing system, the method comprising:
- identifying a plurality of backups of the computing system;
- determining that a collective storage size for the plurality of backups exceeds a backup-storage quota;
- reducing the collective storage size for the plurality of backups by:
- identifying health information stored as metadata to each of the plurality of backups, the health information for each backup comprising a health score that identifies a state of health of the computing system when the backup was created;
- ranking, by comparing the health scores for the plurality of backups, each of the plurality of backups according to their state of health;
- successively deleting backups having lower-ranking states of health until the collective storage size for the plurality of backups is less than or equal to the backup-storage quota;
- wherein the health score for each backup is calculated based on at least one of:
  - a performance index based on at least one performance metric and at least one result of the performance metric represented by at least one of:
    - a running average;
    - a maximum or peak value;
    - an incremental count value;

a stability index based on at least one stability metric and at least one result of the stability metric represented by at least one of:
a running average;
a maximum or peak value;
an incremental count value.

12. The method of claim 11, wherein determining whether to delete one or more of the plurality of backups comprises:

upon comparing the health scores for the plurality of backups, identifying an additional backup with the second lowest state of health;

deleting the additional backup with the second lowest state of health.

13. The method of claim 11, wherein the plurality of backups comprise a plurality of snapshots of the computing system and the backup-storage quota comprises a snapshot-storage quota.

14. The method of claim 11, wherein identifying the plurality of backups of the computing system comprises at least one of:

excluding backups created within a specific date range;

excluding backups created in response to an event.

15. The method of claim 11, wherein the health score for each backup within the plurality of backups comprises at least one of:

an overall health score for the computing system when the backup was created;

a performance score for the computing system when the backup was created;

a stability score for the computing system when the backup was created.

16. The method of claim 11, wherein successively deleting backups having lower-ranking states of health until the collective storage size for the plurality of backups is less than or equal to the backup-storage quota comprises:

providing a user interface for displaying the health scores for the plurality of backups to a user;

displaying the health scores for the plurality of backups using the user interface;

receiving, via the user interface, a request from the user to delete at least one of the plurality of backups;

deleting the at least one backup identified in the request from the user.

17. The method of claim 16, wherein displaying the health scores comprises displaying, for each backup within the plurality of backups, at least one of:

an overall health score for the computing system when the backup was created;

a performance score for the computing system when the backup was created;

a stability score for the computing system when the backup was created.

* * * * *